United States Patent [19]
Metzger et al.

[11] Patent Number: 5,297,107
[45] Date of Patent: Mar. 22, 1994

[54] INTERCONNECT ARRANGEMENT FOR ELECTRONIC COMPONENTS DISPOSED ON A CIRCUIT BOARD

[75] Inventors: Jeffrey A. Metzger; Paul J. Graffam, both of Leominster, Mass.

[73] Assignee: Digital Equipment Corporation, Maynard, Mass.

[21] Appl. No.: 873,922

[22] Filed: Apr. 24, 1992

[51] Int. Cl.⁵ ............................................... H05K 1/18
[52] U.S. Cl. ..................................... 361/778; 29/834; 361/767; 361/792
[58] Field of Search ............... 361/400, 404, 406, 409, 361/412, 414; 29/834

[56] References Cited
U.S. PATENT DOCUMENTS

| | | | |
|---|---|---|---|
| 4,729,061 | 3/1988 | Brown | 361/414 X |
| 4,868,634 | 9/1989 | Ishida et al. | 361/414 X |
| 4,891,789 | 1/1990 | Quattrini et al. | 361/409 X |
| 5,099,395 | 3/1992 | Sagisaka et al. | 361/414 |

Primary Examiner—Eugene F. Desmond
Attorney, Agent, or Firm—Denis G. Maloney; Al Cefalo

[57] ABSTRACT

A system and method for interconnecting electronic components on a circuit board that minimize etch lines, minimize stub lengths, reduce the number of vias that are needed, and densely pack electronic components on the circuit board. According to system and method, electronic components are attached to the top planar surface of the circuit board such that adjacent components are rotated 180° in the plane of the top planar surface. These adjacent electronic components also are offset from one another. The electronic components that are attached to the bottom planar surface of the circuit board also have adjacent electronic components rotated 180° in the plane of the bottom planar surface, and are offset. The arrangement of the components disposed at the bottom planar surface is a mirror image of the components disposed at the top planar surface.

16 Claims, 5 Drawing Sheets

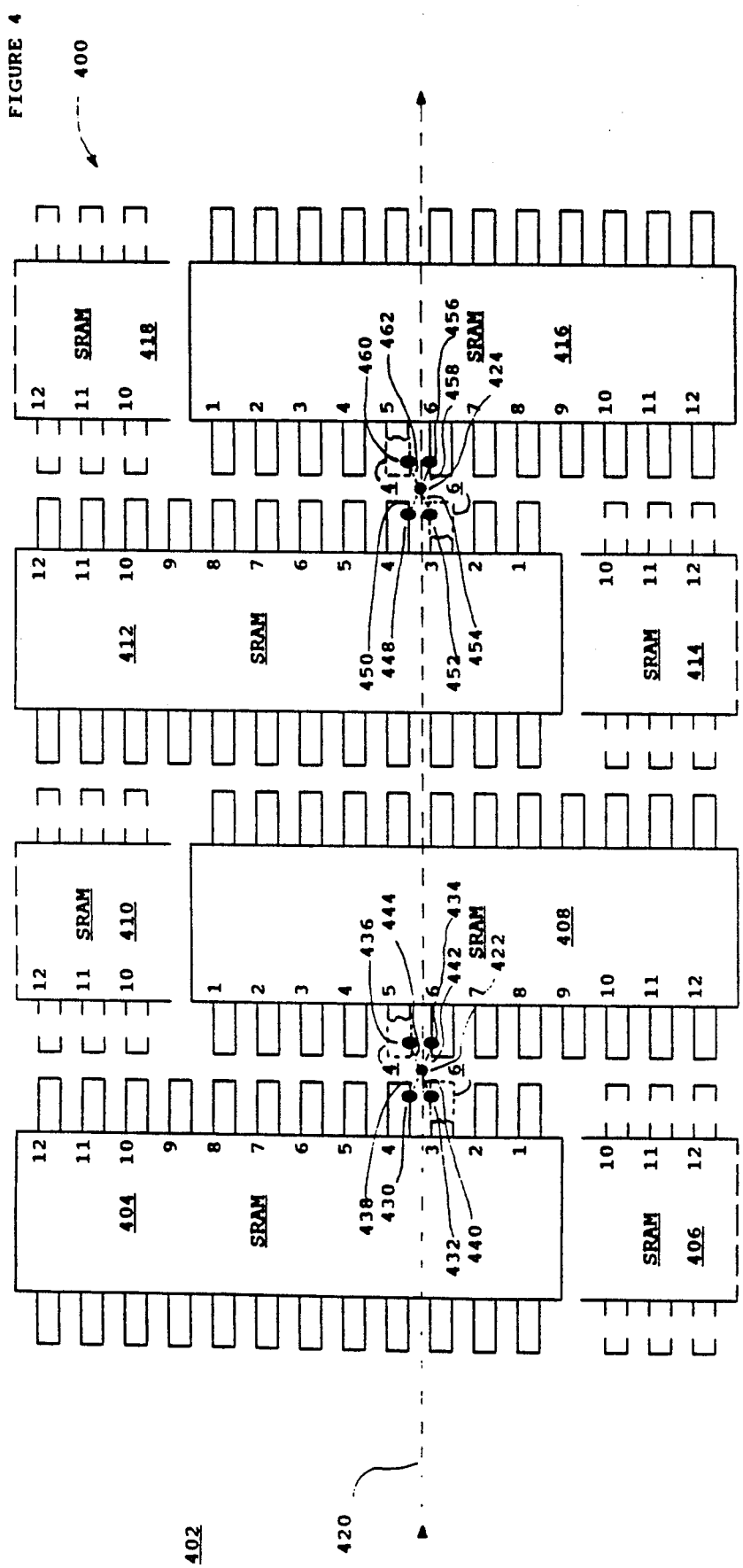

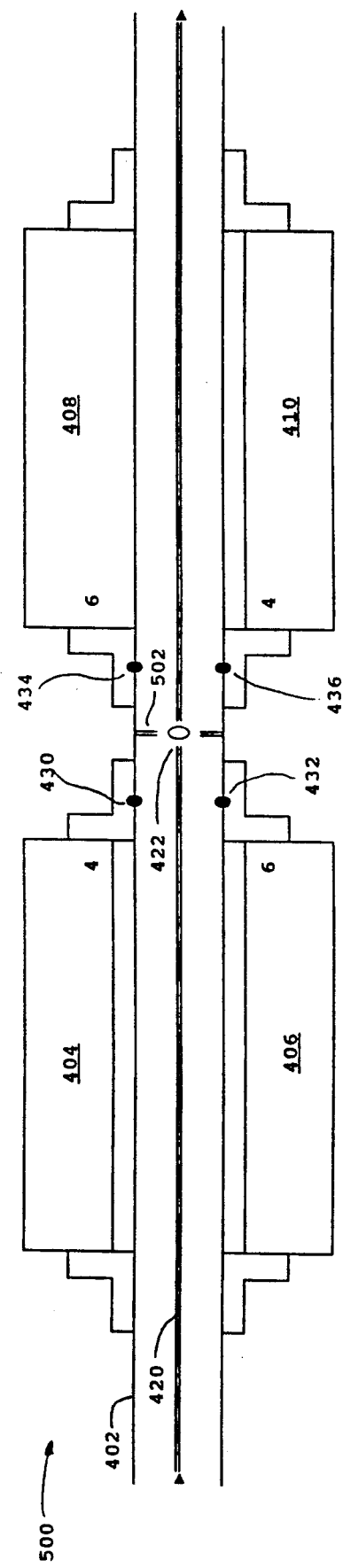

INTERCONNECT ARRANGEMENT FOR ELECTRONIC COMPONENTS DISPOSED ON A CIRCUIT BOARD

FIELD OF THE INVENTION

The present invention relates to an interconnect arrangement for a plurality of electronic components disposed on a substrate. More specifically, the present invention relates to an interconnect arrangement for electronic components, such as memory devices, disposed on a circuit board for improving the performance of the electronic system that uses the circuit board.

BACKGROUND OF THE INVENTION

In the design of circuit boards to which electronic components connect, signal lines, such as address bus lines, may be etched in internal layers of a circuit board. The electronic components that are disposed on the circuit board and connect to the signal lines, preferably, are packed on the surfaces of the circuit board in a space efficient manner. This packing of electronic components on a circuit board is done in light of certain physical and electrical considerations.

The physical considerations are the size of the circuit board, the size of the electronic components that are to be attached to the circuit board, and the area of the circuit board that is available for etching the signal lines.

With regard to electrical considerations, it is desirable that each etch line has as minimal as possible an effect affect on the signal characteristics of the overall design. Thus, the designer attempts to minimize the number of etch lines and minimize the length of any etch lines that are needed. One method to accomplish this is to provide etch lines with common connection nodes to which the number of electronic components may connect.

It is also desirable electrically to minimize the length of the lines (stubs) that are used connect electronic components to a common connection node. Furthermore, it is desirable that the stubs that connect to a particular common connection node be symmetrical.

Another electrical consideration is the desire to minimize the capacitive loading that is caused by vias. Each via impacts the signal on the etch line to which it connects by introducing a capacitive load similar to that of an actual component. This degrades the propagation of the signal along the etch line. Therefore, the number of vias is preferably minimized, and number of components that connect to a single via is the highest possible number considering the physical constraints of the circuit board and the components that attach to it.

Generally, there are two conventional methods of packing electronic components on a circuit board. These are to use a 2-dimensional approach or a simple 3-dimensional approach. Referring to FIG. 1, an example for laying out an area of tightly coupled electronic components, such as static random access memories ("SRAMs"), using the conventional 2-dimensional approach is shown. In this Figure, SRAMs 101, 102, 104, and 106 are mounted on circuit board 100. Circuit board 100 has etch lines 108, 110, 112, 114, 116, and 118 etched in it. In a representative fashion, etch line 108 connects to pin 1 of SRAM 101 at connection 120, connects to pin 1 of SRAM 102 at connection 122, connects to pin 1 of SRAM 104 at connection 124, and connects to pin 1 of SRAM 106 at connection 126. In like manner, etch line 110 connects to pins 2 of the SRAMs, etch line 112 to pins 3 of the SRAMs, etch line 114 to pins 4 of the SRAMs, etch line 116 to pins 5 of the SRAMs, and etch line 118 to pins 6 of the SRAMs.

When the 2-dimensional approach is used, the packing of electronic components depends on the size of the components, such as the SRAMs shown in FIG. 1. The closest that a connection point of one electronic component may be to the connection point of another component is the width of a component. It is also seen that the length of the etch line depends on the specific number of electronic components that are connected to circuit board 100.

A major disadvantages of the 2-dimensional approach is that the etch line will be considerably long. As such, there will be a significant delay associated with accessing the electronic components that are at, or near, the end of a row or column of electronic components.

FIGS. 2 and 3 show circuit board 200 that employs the conventional 3-dimensional approach for packing electronic components, such as SRAMs 201, 202, 204, 206, and 301 and the SRAMs that are disposed opposite SRAMs 202, 204, and 206 which are not shown. According to the conventional 3-dimensional approach, the SRAMs are connected to both planar surfaces of circuit board 200. Etch lines 208, 210, 212, 214, 216, and 218, which may be address lines, are etched in predetermined layers of circuit board 200.

Representative etch line 208 connects to common connection node 220. Common connection node 220 connects to via 302 that extends between the two planar surfaces of circuit board 200. Common connection node 220 connects to pin 1 of SRAM 201 at 306 through via 302 and stub 304, and connects to pin 1 of SRAM 301 at 312 through via 302 and stub 310.

In FIG. 2, the representative common connection nodes to which two SRAMs connect are nodes 220, 222, 224, and 226. It is understood that these nodes are representative of all of the nodes shown in FIGS. 2 and 3.

The conventional 3-dimensional approach has several advantages over the 2-dimensional approach. By using both planar surfaces of circuit board 200, the capability exists to decrease the length of the etch line by one half. It also provides for symmetrical stub lengths for the two SRAMs connected to a common connection node, such as node 220. However, this conventional 3-dimensional approach still has far too many vias.

The present invention solves these and other problems as will be set forth in the remainder of the specification referring the attached drawings.

SUMMARY OF THE INVENTION

The present invention is a system and method for interconnecting electronic components disposed on a circuit board in a manner that improves the operation of the system that uses the circuit board.

According to the present invention, signal lines are etched in the circuit board. Each signal line has common connection nodes along its lengths. Each common connection node connects to a via that extends to predetermined layers of the circuit board. Each node, by a via and respective stubs, connects to four electronic components.

Following the present invention, electronic components are attached to the top planar surface of the circuit board such that adjacent components are rotated 180° in the plane of the top planar surface. These adjacent electronic components also are offset from one another. The electronic components that are attached to the bottom planar surface of the circuit board also have adjacent electronic components rotated 180° in the plane of the bottom planar surface, and are offset. The arrangement of the components disposed at the bottom planar surface is a mirror image of the components disposed at the top planar surface.

The 3-dimensional approach as set forth in the present invention reduces the number of vias, provides short stubs and stubs of uniform length, and minimizes the length of etch lines.

The present invention will be described in greater detail in the remainder of the specification referring the drawings.

BRIEF DESCRIPTION OF THE DRAWINGS

FIG. 4 is a top view of electronic components connected to a circuit board according to the 3-dimensional approach of the present invention.

FIG. 5 is a sectional end view of electronic components connected to a circuit board according to the 3-dimensional approach of the present invention.

DETAILED DESCRIPTION OF THE PRESENT INVENTION

Figure 1:
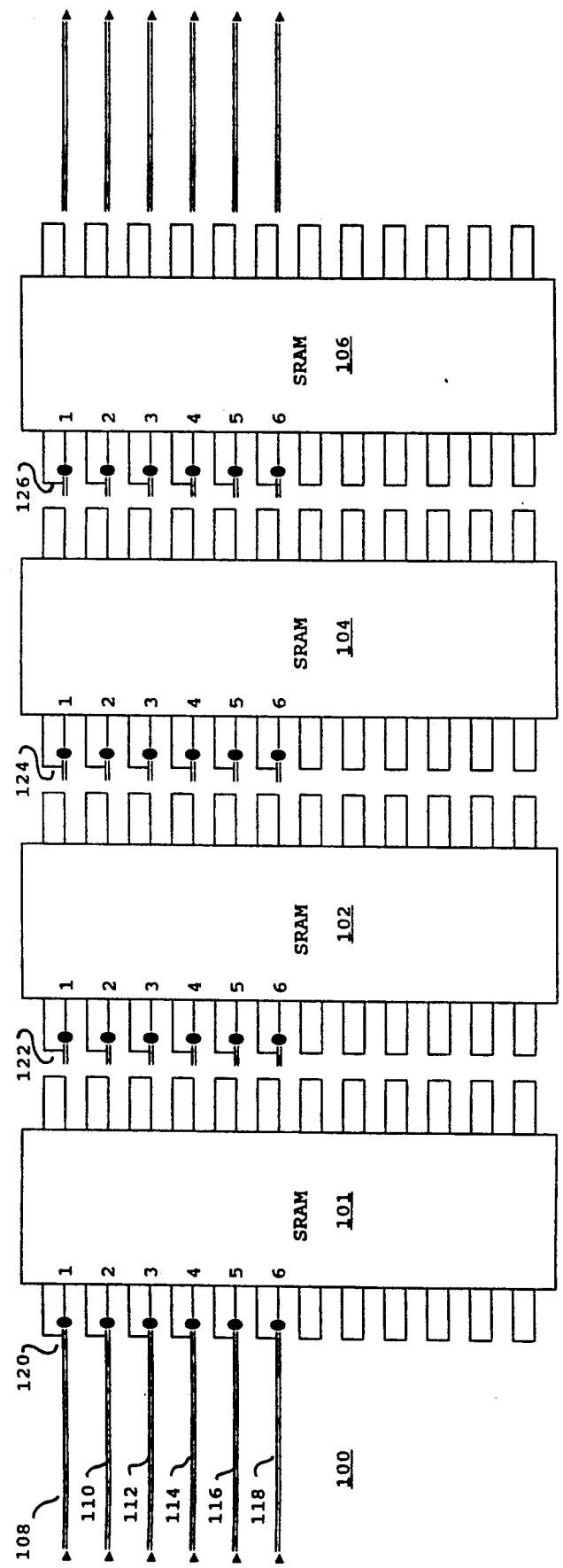
FIG. 1 shows a top view of electronic components connected to a circuit board using the conventional 2-dimensional approach.
Figure 2:
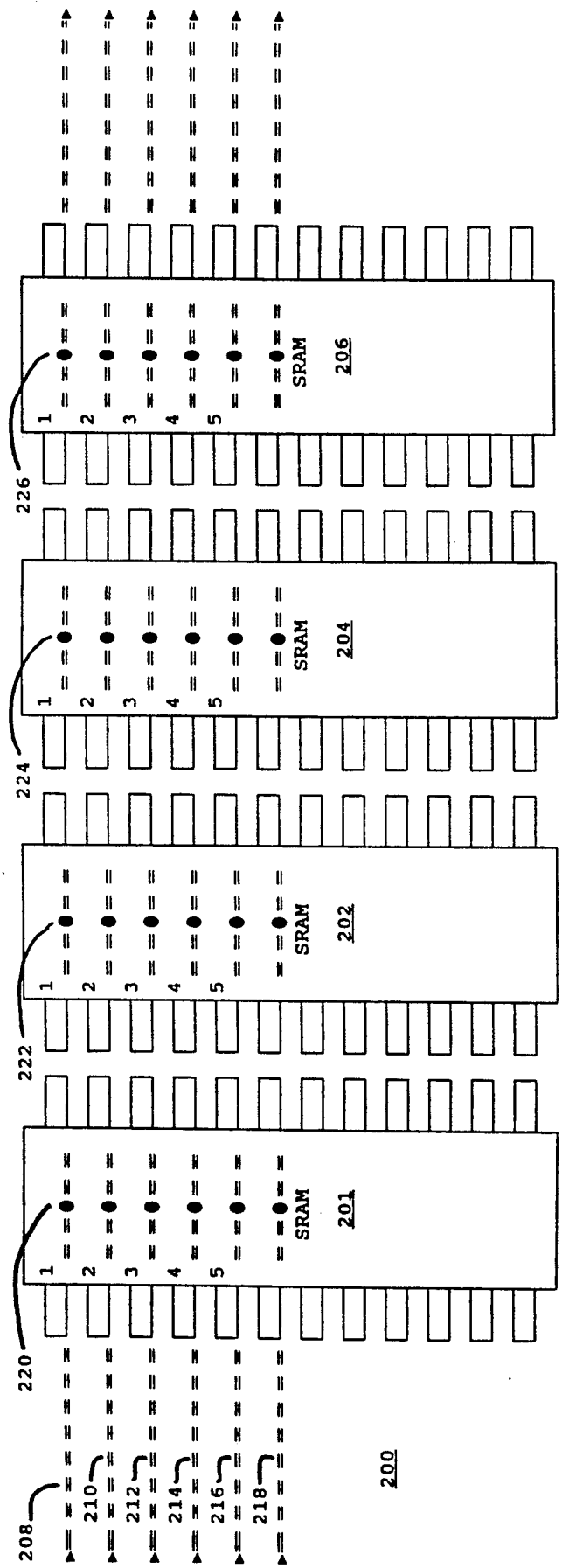
FIG. 2 shows a top view of electronic components connected to a circuit board using the conventional 3-dimensional approach.
Figure 3:
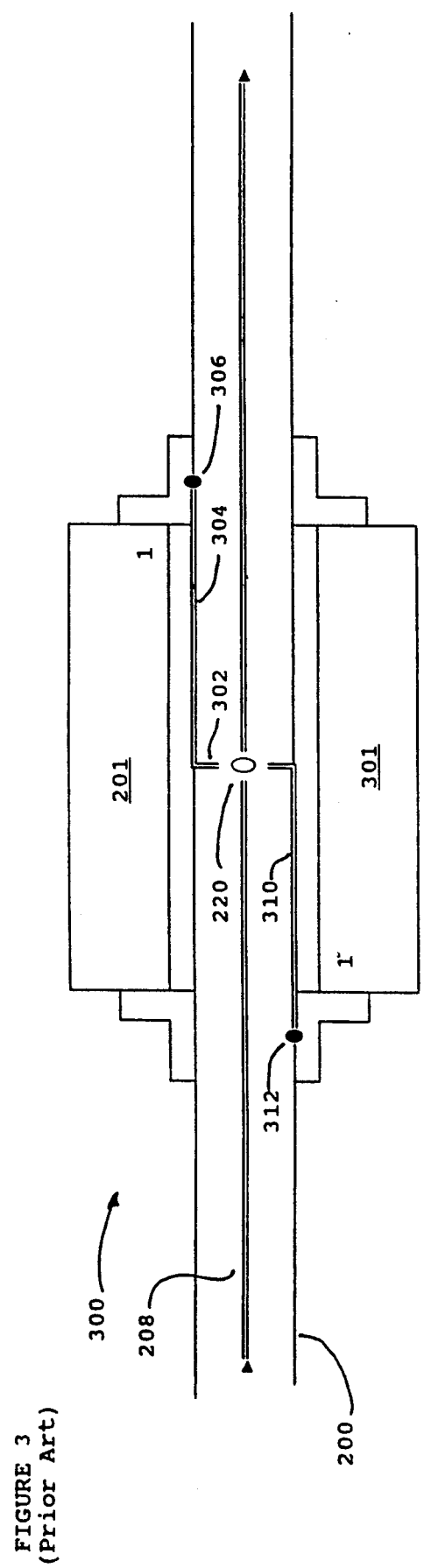
FIG. 3 is a sectional end view of electronic components connected to a circuit board using the conventional 3-dimensional approach.

The present invention is a system and method for interconnecting electronic components on a circuit board that minimize etch lines, minimize stub lengths, reduce the number of vias that are needed, and densely pack electronic components on the circuit board.

The present invention will be described referring to FIGS. 4 and 5. By way of example, the electronic components that are connected to circuit board 402 in FIGS. 4 and 5 are SRAMs. It is understood that the scope of the present invention is not limited only to connecting of SRAMs to the circuit board because in following the present invention any type of electronic component may be connected to the circuit board.

The top planar surface of circuit board 402 has SRAMs 404, 408, 412, and 416 connected to it. Similarly, the bottom planar surface of circuit board 402 has SRAMs 406, 410, 414, and 418 connected to it. The SRAMs that connect to the bottom planar surface are shown in phantom in FIG. 4.

The interconnection of the electronic components at the circuit board will now be described.

Etch line 420 is etched in an interior layer of circuit board 402. Etch line 420 may be an address line that connects, for example, to pin 4 of SRAM 404 and pin 6 of SRAM 408 that are disposed at the top planar surface of circuit board 402, and pin 6 of SRAM 406 and pin 4 of SRAM 410 that are disposed at the bottom planar surface of the circuit board. Etch line 420 connects to common nodes 422 and 424. In FIG. 5, only node 422 is shown.

FIG. 4 shows only one etch line and that is etch line 420. However, it is understood etch line 420 is representative of all of the other etch lines in circuit board 402 that are meant to connect to the other pins of the SRAMs.

Via 502 connects to node 422. The via extends through circuit board 402. However, it may extend to any pair of layers of the circuit board to effect the proper electronic connections to the desired electronic components.

Referring to FIGS. 4 and 5, via 502 connects to pin 4 of SRAM 404 at connection 430 using stub 438, connects to pin 6 of SRAM 406 at connection 432 using stub 440, connects to pin 6 of SRAM 408 at connection 434 using stub 442, and connects to pin 4 of SRAM 410 at connection 436 using stub 444. The stubs are etched in a desired layer of circuit board 402.

The system and method of the present invention call for adjacent SRAMs (electronic components) to be rotated 180° in the plane of the top and bottom surfaces. As shown in FIG. 4, at the top planar surface, SRAM 408 is rotated 180° with respect to SRAM 404, SRAM 412 is rotated 180° with respect to SRAM 408, and SRAM 416 is rotated 180° with respect to SRAM 412. This pattern is repeated for all of SRAMs that are connected to the top planar surface.

The SRAMs on the bottom planar surface of the circuit board are connected using the same method of rotating adjacent SRAMs. Therefore, with regard to the bottom planar surface, SRAM 410 is rotated 180° with respect to SRAM 406, SRAM 414 is rotated 180° with respect to SRAM 410, and SRAM is rotated 180° with respect to SRAM 414. This pattern is repeated for all of the SRAMs that are connected to the top planar surface.

Besides adjacent SRAMs being rotated 180°, they also may be offset. With respect to the top planar surface, SRAMs 408 and 416 are offset with respect to SRAMs 404 and 412. In like manner, at the bottom planar surface, SRAMs 410 and 418 are offset from SRAMs 406 and 414.

The rotation of adjacent electronic components by 180° and their offset according to the present invention places particular pins of four electronic components in close proximity to a common connection node. This results in reducing the number of vias by 50% when compared with the number that are needed when the conventional 3-dimensional approach is used. Moreover, lengths of the stubs are shorter and are symmetrical.

It is to be understood that the scope of the present invention covers other methods for densely packing electronic components on a circuit board, as long as they reduce the number of vias, and shorten the stub lengths, even though it may not be accomplished by rotating adjacent components 180° and offsetting them.

The terms and expressions which are employed herein are used as terms of expression and not of limitation. And, there is no intention, in the use of such terms and expressions, of excluding the equivalents of the features shown, and described, or portions thereof, it being recognized that various modifications are possible within the scope of the invention.

What is claimed is:

1. A substrate with improved electrical performance, comprising:
   at least one signal line extending a predetermined distance within the substrate, with the signal line having at least four common connection nodes disposed along its length;

via means that connects to the signal line at the common connection node; and a plurality of electrical component connection means that connect a plurality of electrical components disposed at first and second opposing surfaces of the substrate to the via means, with each of the electrical component connection means for connecting a predetermined connection point of an electrical component disposed at first or second opposing surface of the substrate to the via means, the electrical components being arranged at the first and second opposing surfaces of the substrate such that the predetermined connection points of the plurality of electronic components at each surface are an optimal minimum distance from the common connection node.

2. The substrate as recited in claim 1, wherein the substrate is a circuit board.

3. The substrate as recited in claim 1, wherein the substrate include a plurality of internal layers.

4. The substrate as recited in claim 3, wherein the signal line is etched in a predetermined internal layer of the substrate.

5. The substrate as recited in claim 4, wherein the via means that connects to the common connection node also connects to predetermined layers of the substrate.

6. The substrate as recited in claim 1, wherein each electrical component connection means includes a stub.

7. The substrate as recited in claim 6, wherein each stub is substantially the same length.

8. A substrate with improved electrical performance, comprising:

a plurality of separate signal lines that extend respective predetermined distances within the substrate, with each signal line having at least one common connection node disposed along its length;

a separate via means that connects to each of the common connection nodes of the separate signal lines; and a plurality of electrical component connection means that connect a plurality of electrical components disposed at first and second opposing surfaces of the substrate to each of the via means, with each of the electrical component connection means associated with a particular via means for connecting a predetermined connection point of an electrical component disposed at first or second opposing surface of the substrate to that particular via means, the electrical components being arranged at the first and second opposing surfaces of the substrate such that predetermined connection points of a plurality of electrical components at each surface, and associated with a particular via means, are an optimal minimum distance from the common connection node to which it connects through that particular via means.

9. The substrate as recited in claim 8, wherein the substrate is a circuit board.

10. The substrate as recited in claim 8, wherein the substrate includes a plurality of internal layers.

11. The substrate as recited in claim 10, wherein each signal line is etched in a predetermined internal layer of the substrate.

12. The substrate as recited in claim 11, wherein each via means that connects to a common connection node also connects to predetermined layers of the substrate.

13. The substrate as recited in claim 8, wherein each electrical component connection means includes a stub.

14. The substrate as recited in claim 13, wherein each stub that connects to a particular via means has substantially the same length.

15. The substrate as recited in claim 8, wherein at least four electrical components connect to each common connection node.

16. A method of interconnecting electrical components on a substrate having first and second opposing surfaces, the substrate having internally etched signal lines, common connection nodes along the respective signal lines, and vias associated with each common connection node, comprising the steps of:

disposing a plurality of electrical components at both surfaces of the substrate such that separate predetermined common connection points of at least four of said plurality of electrical components associated with a particular via means and common connection node are arranged so that there is an optimal minimum distance between the predetermined common connection points and that common connection node.

* * * * *